United States Patent
Takizawa et al.

(10) Patent No.: US 10,804,675 B2
(45) Date of Patent: Oct. 13, 2020

(54) TO-CAN PACKAGE SEMICONDUCTOR LASER DEVICE HAVING A PINLESS REGION ON THE UNDERSIDE OF THE PACKAGE

(71) Applicant: USHIO DENKI KABUSHIKI KAISHA, Tokyo (JP)

(72) Inventors: Yasushi Takizawa, Tokyo (JP); Masato Hagimoto, Tokyo (JP); Shintaro Miyamoto, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/272,632

(22) Filed: Sep. 22, 2016

(65) Prior Publication Data
US 2017/0093123 A1 Mar. 30, 2017

(30) Foreign Application Priority Data
Sep. 30, 2015 (JP) .................................. 2015-193338

(51) Int. Cl.
*H01S 5/024* (2006.01)
*H01S 5/022* (2006.01)
*H01S 5/0683* (2006.01)

(52) U.S. Cl.
CPC ...... *H01S 5/02469* (2013.01); *H01S 5/02236* (2013.01); *H01S 5/02244* (2013.01);
(Continued)

(58) Field of Classification Search
CPC ............. H01S 5/02212; H01S 5/02469; H01S 5/02244
See application file for complete search history.

(56) References Cited

U.S. PATENT DOCUMENTS

| 6,907,053 B2 * | 6/2005 | Ohgiyama | G11B 7/082 372/36 |
| 7,622,750 B2 * | 11/2009 | Fujino | H01S 5/02244 257/100 |
| 2015/0103856 A1 * | 4/2015 | Hagino | H01S 5/02212 372/44.01 |

FOREIGN PATENT DOCUMENTS

| JP | S61-107784 A | 5/1986 |
| JP | S63-245986 A | 10/1988 |

(Continued)

OTHER PUBLICATIONS

An Office Action mailed by the Japanese Patent Office dated Feb. 14, 2017, which corresponds to Japanese Patent Application No. 2015-193338 and is related to U.S. Appl. No. 15/272,632; with English translation.
(Continued)

*Primary Examiner* — M. A. Golub-Miller
(74) *Attorney, Agent, or Firm* — Studebaker & Brackett PC

(57) ABSTRACT

Disclosed herein is a semiconductor laser device that has a higher heat dissipation property, comprising: a base; a block protruding from a first surface of the base; a laser chip being joined onto a side face rising upward from the first surface, and allowing heat generated to be transferred to the block; a cap covering the block and be fixed on the first surface; a window provided in the cap and allowing the light emitted from the laser chip to pass through; at least one lead pin penetrating the base, one end of the lead pin protruding inside the cap, and any of the lead pin being positioned at an opposite side of the block with respect to the laser chip; and a pinless region extending in a range of the base corresponding to a rear side of the block and provided with none of pins including the lead pin.

9 Claims, 7 Drawing Sheets

(52) U.S. Cl.
CPC ...... *H01S 5/02276* (2013.01); *H01S 5/02212* (2013.01); *H01S 5/0683* (2013.01)

(56) References Cited

FOREIGN PATENT DOCUMENTS

| | | |
|---|---|---|
| JP | H09-189531 A | 7/1997 |
| JP | 2004-006659 A | 1/2004 |
| JP | 2004-193315 A | 7/2004 |
| JP | 2004-349320 A | 12/2004 |
| JP | 2005-026333 A | 1/2005 |
| JP | 2006-041085 A | 2/2006 |
| JP | 2007-220843 A | 8/2007 |
| JP | 2011-018800 A | 1/2011 |
| JP | 2014-027307 A | 2/2014 |

OTHER PUBLICATIONS

An Office Action mailed by the Japanese Patent Office dated Aug. 10, 2017, which corresponds to Japanese Patent Application No. 2015-193338 and is related to U.S. Appl. No. 15/272,632; with English translation.

An Office Action mailed by the Japanese Patent Office dated Oct. 19, 2017, which corresponds to Japanese Patent Application No. 2015-193338 and is related to U.S. Appl. No. 15/272,632; with English translation.

An Office Action mailed by the Japanese Patent Office dated Dec. 27, 2017, which corresponds to Japanese Patent Application No. 2015-193338 and is related to U.S. Appl. No. 15/272,632; with English translation.

\* cited by examiner

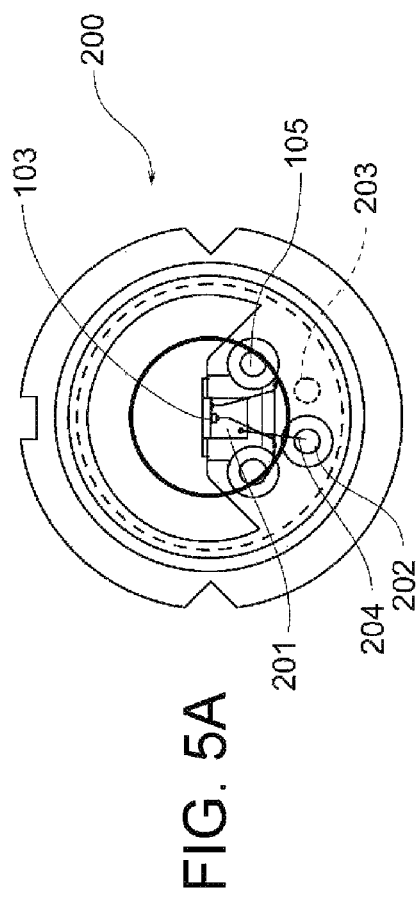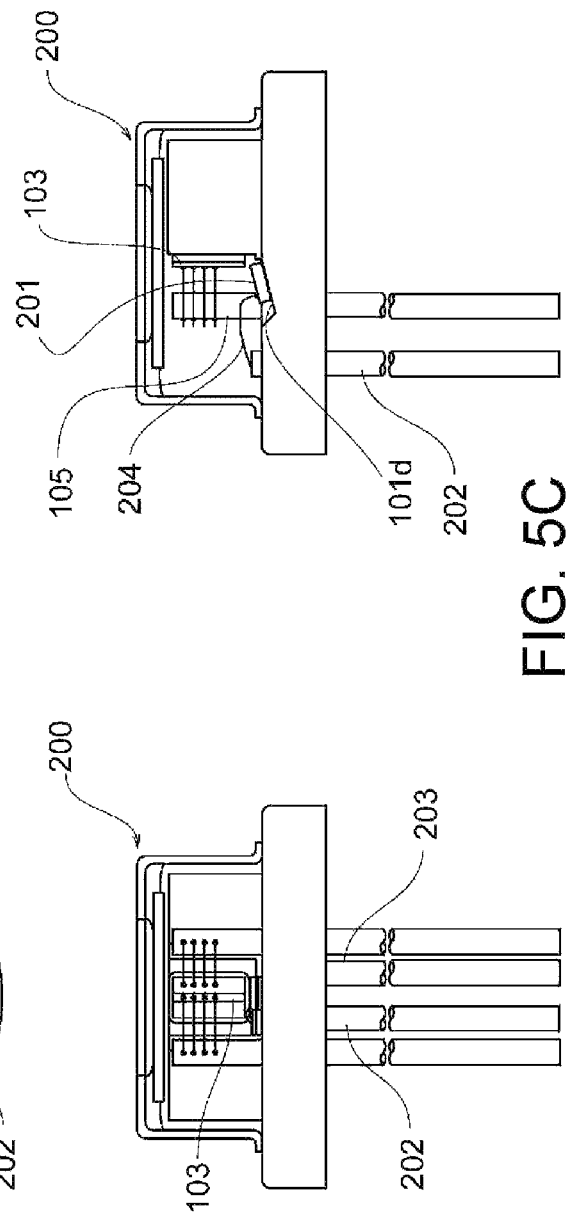

TO-CAN PACKAGE SEMICONDUCTOR LASER DEVICE HAVING A PINLESS REGION ON THE UNDERSIDE OF THE PACKAGE

FIELD OF THE INVENTION

The present invention relates to a semiconductor laser device.

DESCRIPTION OF THE RELATED ART

Conventionally, in a semiconductor laser device (that is, a laser diode; also abbreviated as "LD"), a semiconductor chip (or laser chip) is arranged such that a luminous (light emitting) point is to be positioned at a center of a can (or canned) package, which corresponds to and referred to as a "stem", in order to facilitate an easier alignment of a light (optical) axis for a user.

In the meantime, the semiconductor laser device has been required to achieve a high output power (or high power) more and more. To cope with this requirement, in a certain type of semiconductor laser device of an end face light emission type, as one of possible solutions, a cavity length (that is, resonator length) of the semiconductor chip has been made longer (as disclosed in, for example, Patent Literature 1).

On the other hand, as the semiconductor laser device achieves a higher output power, a heat generation from the semiconductor chip when being activated becomes higher. For this reason, it has been required to improve a heat exhaust (or heat dissipation) property of the can package (i.e., stem). To cope with this requirement, various contraptions or improvements have been challenged on a shape of a heat dissipation (or heat radiation) block in which the semiconductor chip is disposed (as disclosed in, for example, Patent Literature 2 and Patent Literature 3).

LISTING OF REFERENCES

Patent Literatures

Patent Literature 1: Japanese Patent Application Laid-open Publication No. 2006-041085 A
Patent Literature 2: Japanese Patent Application Laid-open Publication No. 2007-220843 A
Patent Literature 3: Japanese Patent Application Laid-open Publication No. 2004-349320 A

SUMMARY OF THE INVENTION

Problems to be Solved by the Invention

However, in the case of a semiconductor laser device with further advanced high output power, the heat generation from the semiconductor chip becomes further larger. It has therefore entailed a problem that the generated heat cannot be sufficiently radiated or discharged from the stem, no matter how much the shape of the heat dissipation block is challenged to be improved to dissipate or radiate the heat. For this reason, the semiconductor chip itself necessarily becomes at the high temperature. At the same time, in some cases, a quality of an emitted laser light and also a life duration of the semiconductor laser device itself have been adversely affected.

In the meantime, even if the heat dissipation block is simply enlarged, when being covered by a cap, the permissible size of the heat dissipation block to be disposed inside the cap is necessarily constrained by the cap. It has therefore entailed a problem that a pin for power supply and the heat dissipation block interfere with each other in terms of an arrangement thereof.

The present invention has been made in view of the above described circumstances and an object thereof is to provide a semiconductor laser device that is capable of attaining a higher heat dissipation or radiation property.

Solution to the Problem

In order to solve the above mentioned problems, according to one aspect of the present embodiments of the present invention, there is provided a semiconductor laser device. The semiconductor laser device comprises: a base; a block configured to protrude from a first surface of the base; a laser chip configured to be directly or indirectly joined to a side surface of the block rising upward from the first surface of the base and allow heat generated when emitting light to be transferred to the block; a cap configured to cover the block and be fixed on the first surface of the base; a window provided on the cap and configured to allow the light emitted from the laser chip to pass through; at least one lead pin configured to penetrate the base, one end of the lead pin configured to protrude inside the cap, and any of the lead pin being positioned at an opposite side of the block with respect to the laser chip; and a pinless region on the base configured to extend in a range corresponding to a rear side of the block and to be provided with none of pin including the lead pin.

According to the above configured semiconductor laser device, it makes it possible to arrange a larger block inside the cap without the block interfering with the lead pin in terms of an arrangement thereof, and also to discharge or radiate the heat from the pinless region through the block. As a result, a higher heat dissipation property is attainable.

According to another aspect of the present embodiment, in the above mentioned semiconductor laser device, preferably, the pinless region of the base may be of a flat surface. With the pinless region being of the flat or planar surface, it makes it possible to easily enhance the heat dissipation property by arranging on the flat pinless region a heat dissipating member or the like to contact the pinless region.

According to yet another aspect of the present embodiment, in the above mentioned semiconductor laser device, preferably, two lead pins for power supply to the laser chip may be provided as the lead pin, and those lead pins for the power supply may be disposed at a position within a range opening at an angle equal to or greater than 60 degrees and equal to or less than 120 degrees with the laser chip being a vertex. More preferably, the lead pins for the power supply may be disposed at a position within a range opening at an angle equal to or greater than 90 degrees and equal to or less than 110 with the laser chip being the apex.

By employing the above configuration in which the two lead pins are disposed at the position within a range opening at the angle equal to or less than 120 degrees, and preferably equal to or less than 110 degrees, it makes it possible to prevent the lead pins from interfering with a large block in terms of the arrangement.

On the other hand, by employing the above configuration in which the two lead pins are disposed at the position within the range opening at the angle equal to or greater than 60 degrees, and preferably equal to or greater than 90 degrees, it makes it possible to achieve the space saving by allowing the lead pins to sufficiently approach the block while avoiding the short circuit between the lead pins.

According to yet another aspect of the present embodiment, in the above mentioned semiconductor laser device, preferably, the block may occupy an area of the first surface equal to or greater than 35% of an area of the first surface enclosed with an inner face of the cap.

According to yet another aspect of the present embodiment, in the above mentioned semiconductor laser device, preferably, the block may have a breadth maximum in a direction along the first surface greater than a distance from the first surface and a forward luminous point of the laser chip.

By employing the above configuration having such a larger block, it makes it possible to quickly transfer an exhaust heat of the laser chip to the block and to dissipate or radiate the exhaust heat from the semiconductor laser device.

According to yet another aspect of the present embodiment, in the above mentioned semiconductor laser device, the laser chip may be supplied with power by a plurality of wires from at least one of the lead pin. Even in the case of a laser chip with a higher output power employing a plurality of wires for the power supply, since the exhaust heat can be quickly dissipated or radiated, it makes it possible to attain a higher quality of the laser light and a longer life duration of the semiconductor laser device.

According to yet another aspect of the present embodiment, in the above mentioned semiconductor laser device, the lead pin may be connected to a wire at a position visible through the window. Since the wire connection to the lead pin is visible through the window, it makes it possible to easily determine or confirm a connection failure (or poor connection) of the wire connection or the like.

According to yet another aspect of the present embodiment, in the above mentioned semiconductor laser device, preferably, the block may include a chip joining portion configured to have the side surface to which the laser chip is joined, and a protruding portion configured to protrude towards a side of the lead pin than the side surface of the chip joining portion. With the protruding portion being provided, it makes it possible to enhance a heat capacity of the block so as to improve the heat dissipation property.

According to yet another aspect of the present embodiment, in the above mentioned semiconductor laser device, the block may include a wire joining surface to which the wire is joined in the protruding portion, and a direction of the wire joining surface may align with a direction of the side surface to which the laser chip is joined. With the protruding portion being used in place of the lead pin, it makes it possible to employ one of the lead pin or pins of which one end protrudes inside the cap as a pin for the power supply to a photodiode.

According to yet another aspect of the present embodiment, in the above mentioned semiconductor device, a protective element joined to the block and configured to protect the laser chip may be provided. As the protective element, for example, a Zener diode or the like may be provided that is connected to the laser chip in parallel to prevent an excessive inverse current to the laser chip. As a result, it makes it possible to assure the safety of the laser chip.

Advantageous Effect of the Invention

According to the above mentioned aspects of the semiconductor laser device of the various embodiments, it makes it possible to attain a higher heat dissipation property.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 5A is a view illustrating a second embodiment of the semiconductor laser device according to the present invention;

FIG. 5B is a view illustrating a second embodiment of the semiconductor laser device according to the present invention;

FIG. 5C is a view illustrating a second embodiment of the semiconductor laser device according to the present invention;

DETAILED DESCRIPTION OF THE INVENTION

Hereinafter, embodiments of the semiconductor laser device according to the present invention will be explained in detail with reference to accompanying drawings.

First Embodiment

Figure 1A:
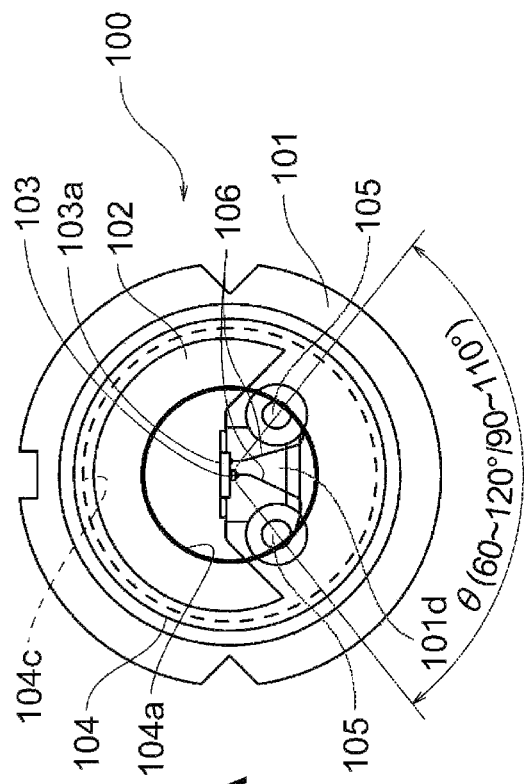
FIG. 1A is a top view illustrating a first embodiment of the semiconductor laser device according to the present invention.
Figure 1C:
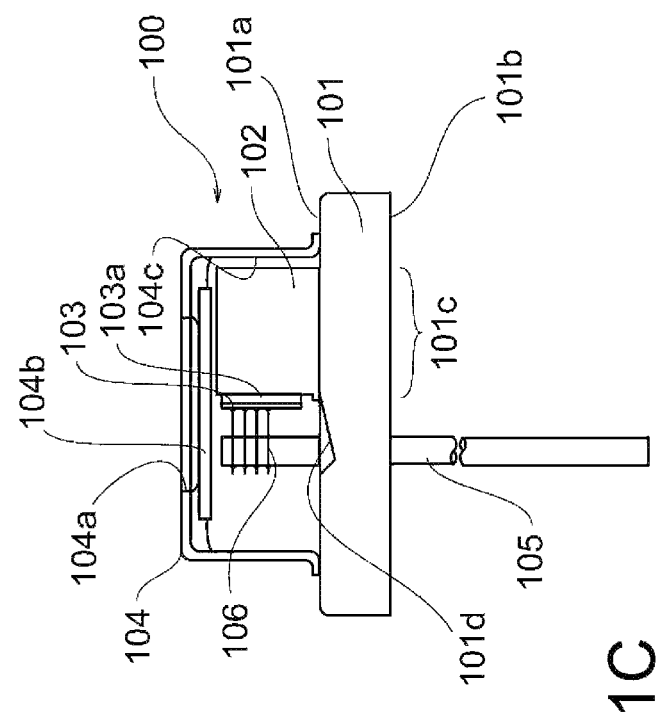
FIG. 1C is a cross sectional view illustrating the first embodiment of the semiconductor laser device according to the present invention.
Figure 1B:
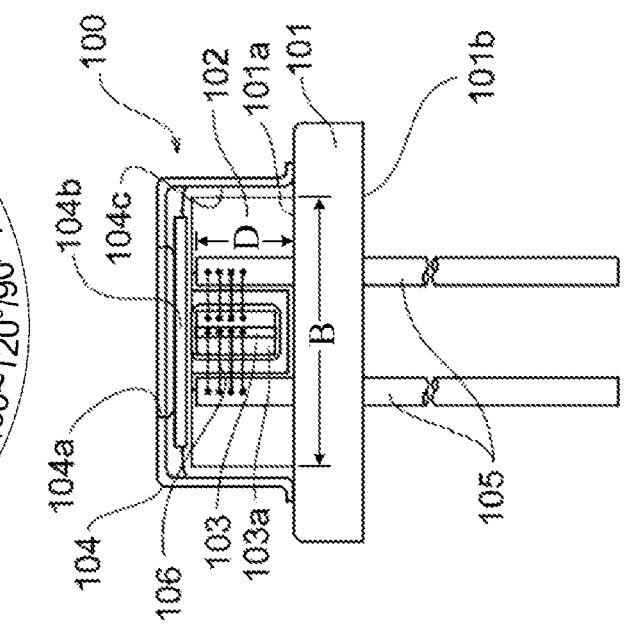
FIG. 1B is a front view illustrating the first embodiment of the semiconductor laser device according to the present invention.
Figure 2:
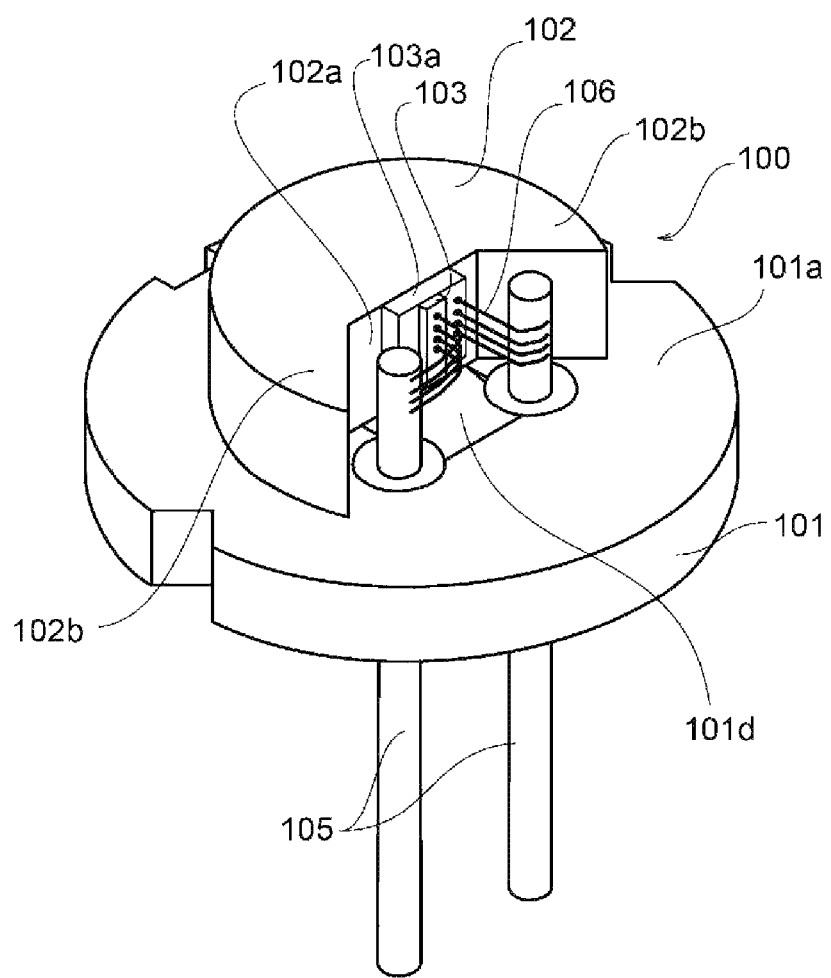
FIG. 2 is a perspective view illustrating the first embodiment of the semiconductor laser device according to the present invention.

FIGS. 1A to 1C are view illustrating a first embodiment of a semiconductor laser device. More particularly, FIG. 1A is a top view, FIG. 1B is a front view, and FIG. 1C is a cross sectional view of the semiconductor laser device according to the first embodiment, respectively. Also, FIG. 2 is a perspective view illustrating the first embodiment of the semiconductor laser device.

FIGS. 1A to 1C illustrate the semiconductor laser device in a state that an interior of a can (canned) package (hereinafter simply referred to as "can package") is transparently observed, respectively. FIG. 2 illustrates the semiconductor laser device in a state that a stem cap is removed.

The semiconductor laser device 100 according to the first embodiment is provided with a stem base 101, a stem block 102, a laser chip 103, a stem cap 104, a lead pin for power supply 105, and a wire 106.

The stem block 102 protrudes from an upper surface 101a of the stem base 101. The stem cap 104 is fixed to the upper surface 101a of the stem base 101 so as to cover the stem block 102. Any of the stem base 101, the stem block 102, and the stem cap 104 is made from metal so as to constitute the can package. Here, the stem base 101 corresponds to an example of a base according to the present invention. Likewise, the stem block 102 corresponds to an example of a block according to the present invention, and the stem cap 104 corresponds to an example of a cap according to the present invention, respectively. Nevertheless, throughout the specification, it is not intended to limit the present invention.

The stem block 102 includes a chip mounting surface 102a on a part of a side surface of the stem block 102 rising upward from an upper surface 101a of the stem base 101. Here, the chip mounting face 102a corresponds to an example of a chip joining portion according to the present invention.

A laser chip 103 is indirectly joined to the chip mounting surface 102a through, for example, a sub-mount 103a. It should be noted that the laser chip 103 may be directly joined to the chip mounting surface 102a. Nevertheless, in the present embodiment, it is assumed that the sub-mount 103a is employed.

A luminous point of the laser chip 103 is positioned at a center of the stem base 101 which has an outer periphery of a substantially circular shape. Heat generated by the laser chip 103 when the light is emitted is transferred to the stem block 102.

In the present embodiment, a diameter of the stem base of the circular shape is assumed to be φ9 mm. Nevertheless, alternatively φ16 mm, φ5.6 mm, and φ3.8 mm and the like may be possibly used, and needless to say, not limited to φ9 mm.

In addition, the stem block 102 and the stem base 101 are not necessarily configured with the same material. Alternatively, they may be configured with the different material each other. Also, a part of the stem base may be configured with a material of the stem block, and vice versa. The present embodiment is not limited to the above configuration in particular. It should be noted that the laser chip 103 may be of a multi-emitter type which emits laser beams with multiple spots. Nevertheless, in the present embodiment, the laser chip 103 is assumed to be of a single emitter type which emits a laser beam with single spot. Again, nevertheless, throughout the specification, it is not intended to limit the present invention.

The stem cap 104 having a cylindrical shape is provided with a window 104a having a circular or round shape, and a glass 104b is attached to the window 104a. The laser light emitted or radiated from the laser chip 103 passes through the window 104a of the stem cap 104 and then exits outside the stem.

It should be noted that the window 104a may be solely an aperture without the glass. Nevertheless, in the present embodiment, the window 104a is assumed to have the glass 104b. In addition, the glass to be employed is not limited to a flat glass but also may be a spherical lens or an aspherical lens, alternatively. The window 104a corresponds to an example of a window according to the present invention.

With the laser chip 103 being covered by the stem cap 104, it makes it possible to protect the laser chip 103 from a breakage due to an incidental contact from an exterior, or from an adhesion of a foreign substance such as a grit and dust or the like. Also, with the laser chip 103 being sealed in an airtight manner by the stem cap 104, it makes it possible to prevent the laser element from being deteriorated due to moisture in an atmosphere or an adhesion of an organic substance or the like. As a result, it makes it possible to realize the semiconductor laser device with a higher reliability or credibility.

An inclined plane 101d is formed on a part of the upper surface 101a of the stem base 101. Light emitted from a backward of the laser chip 103, which is in principle unnecessary, is reflected on the inclined plane 101d so that it makes it possible to prevent the unnecessary light from interfering with the light emitted from forward.

A lead pin 105 for power supply penetrates the stem base 101, and one end of the lead pin 105 protrudes into an inner side, which is covered by the stem cap 104. A wire 106 is connected from the one end of the lead pin 105 to the laser chip 103. The laser chip 103 according to the present embodiment is a laser chip with a high output power of which a light output is, for example, equal to or greater than 1 W. Assuming the current equal to or greater than 1 A and the voltage equal to or greater than 2 V, electric power equal to or greater than 2 W is supplied from one of the lead pin 105 for the power supply through a plurality of wires 106 to the laser chip 103.

When the wire has a diameter of φ20 μm, the wire has a tolerability against the current of approximately 1 A per one wire. Taking this resistance into consideration, in the case of a high output power laser in the order of watt (W), a plurality of wires are required, because normally high current equal to or greater than 1 A. Those wires 106 are joined to the lead pin 105 for the power supply at a position visible through the window 104a of the stem cap 104 so that the wires 106 can be easily determined or observed even when a connection failure or poor connection occurs.

It should be noted that, in the case of one wire, when the breaking of wire or disconnection occurs, it is possible to detect such breaking of the wire by a characteristic inspection. On the other hand, in the case of a plurality of wires, even when the breaking of wire of one of the plurality of wires occurs, it is impossible to detect the breaking of the wire by the characteristic inspection. Thus, the heat dissipation property is lowered to adversely affect a life duration of the semiconductor laser device. In this regard, according to the present embodiment, an appearance inspection through the window 104a is possible so that a better and longer life duration can be assured.

According to the present embodiment, two lead pins having different polarities each other as the lead pins 105 for the power supply. One lead pin out of the two lead pins is connected to one side face of the laser chip 103 by the wire 106, and the other lead pin is connected to the other side face of the laser chip 103 through the sub-mount 103a and the wire 106.

It should be noted that, in the case of one wire, when the breaking of wire or disconnection occurs, it is possible to detect such breaking of the wire by a characteristic inspection. On the other hand, in the case of a plurality of wires, even when the breaking of wire of one of the plurality of wires occurs, it is impossible to detect the breaking of the wire by the characteristic inspection. Thus, the heat dissipation property is lowered to adversely affect a life duration of the semiconductor laser device. In this regard, according to the present embodiment, an appearance inspection through the window 104a is possible so that a better and longer life duration can be assured.

According to the present embodiment, two lead pins having different polarities each other as the lead pins 105 for the power supply. One lead pin out of the two lead pins is connected to one side face of the laser chip 103 by the wire 106, and the other lead pin is connected to the other side face of the laser chip 103 through the sub-mount 103a and the wire 106.

Both of the two lead pins 105 for the power supply are positioned at an opposite side of the stem block 102 with respect to the laser chip 103, respectively. In other words, the laser chip 103 is sandwiched between the lead pins 103 for the power supply and the stem block 102. An opening angle between the two lead pins 105 for the power supply is, with the laser chip 103 being a vertex, for example, 101 degrees, when measuring by employing centers of the lead pins 105 for the power supply.

If the opening angle between the two lead pins 105 is too large, then the lead pins 105 for the power supply and the stem block 102 interfere each other in terms of an arrangement thereof. On the other hand, if the opening angle between the two lead pins 105 is too small, then it impedes the joining or coupling of the laser chip 103 to the chip mounting surface 102a, or otherwise the short circuit occurs between the lead pins 105 for the power supply.

Taking the above circumstances into consideration, the opening angle between the two lead pins 105 for the power supply is, with the laser chip 103 being a vertex, preferably equal to or greater than 60 degrees and equal to or less than 120 degrees, and more preferably equal to or greater than 90 degrees and equal to or less than 110 degrees.

The stem block 102 having a shape in which a cylinder is partially cut off (cut out) is covered by the stem cap 104 in a state that the stem block 102 is arranged to be distant from an inner wall 104c of the stem cap 104 via some gap. In the first embodiment, the stem block 102 occupies an area of, for example, 50% of the upper surface 101a of the stem base 101 in a range with 0.25 mm, which is covered by the step cap 104, on the upper surface 101a of the stem base 101. It is preferable that the stem block 102 has an occupancy equal to or greater than 35% in order to improve the heat dissipation property.

Hereinafter, a relationship between the occupancy and the heat dissipation property of the stem block will be discussed.

Figure 3A:
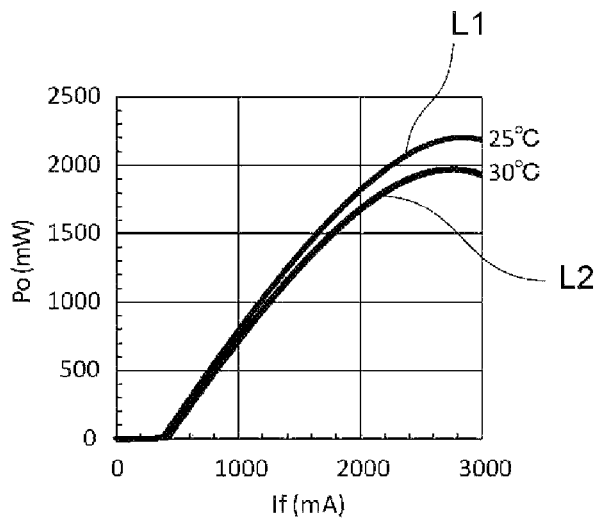
FIG. 3A is a chart depicting a relationship between an occupancy of a stem block and a heat dissipation property.
Figure 3B:
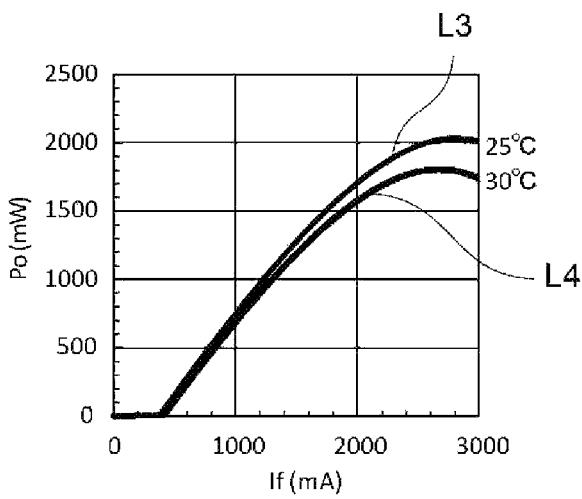
FIG. 3B is a chart depicting a relationship between an occupancy of a stem block and a heat dissipation property.

FIGS. 3A and 3B are charts illustrating the relationship between the occupancy and the heat dissipation property of the stem block.

More particularly, FIGS. 3A and 3B illustrate measurement results of an optical output—current characteristics, when a laser chip oscillating at a wavelength of 638 nm is mounted to continuously oscillate, for the semiconductor laser device according to the first embodiment, which includes the stem block with the occupancy of 50%, and a semiconductor laser device according to a comparative example, which includes a stem block with the occupancy of 25%.

FIG. 3A shows a graph L1 in the case that the semiconductor laser device according to the first embodiment operates at an operational temperature of 25 degrees Celsius, and a graph L2 in the case that the semiconductor laser device according to the first embodiment operates at an operational temperature of 30 degrees Celsius. On the other hand, FIG. 3B shows a graph L3 in the case that the semiconductor laser device according to the comparative example operates at an operational temperature of 25 degrees Celsius, and a graph L4 in the case that the semiconductor laser device according to the comparative example operates at an operational temperature of 30 degrees Celsius.

Comparing those graphs in FIGS. 3A and 3B, it can be confirmed that the observed results of optical output—current characteristics are substantially the same between the comparative example at the operational temperature of 25 degrees Celsius (graph L3) and the first embodiment at the operational temperature of 30 degrees Celsius (graph L2). In other words, it is confirmed that, with the occupancy being increased from 25% to 50%, it makes it possible to improve the heat dissipation property to the extent of 5 degrees Celsius in terms of operational temperature, and therefore it makes it possible to achieve the characteristic improvement in the continuous operation.

In this regard, temperature difference by 5 degrees Celsius corresponds to, when converted into a life duration of the semiconductor laser device, a difference by 1.5 times in terms of the life duration (where commonly used activation energy value is 0.7 eV in Arrhenius equation).

In other word, it is turned out that it can achieve an improvement of −1 degrees Celsius in the operational temperature and +10% in the life duration, when the occupancy increases by +5%. It means that, when compared to the occupancy of 25% in the comparative example, occupancy equal to or greater than 35% can attain an effect to extend the life duration by +20% or more so that a definitive improvement effect can be obtainable. The above mentioned improvement effect indicates an effect to increase or enhance the heat dissipation property. Accordingly, it is needless to say that a similar effect is obtainable when the laser chip has a different wavelength band or a material system or the like.

Referring back to FIGS. 1A to 1C and 2, the first embodiment of the semiconductor laser device will be again resumed.

The stem block 102 according to the first embodiment includes protruding portions 102b that protrudes towards the side of the lead pins 105 for the power supply than (beyond) the chip mounting surface 102a at both sides with respect to the laser chip 103. The existence of the protruding portions 102b can attain a desirable occupancy, and also contribute to a superior or satisfactory heat dissipation property due to an enhanced heat capacity and an increased cross section area of the stem block 102. The protruding portion 102b corresponds to an example of a protruding portion according to the invention.

Although an upper limit for increasing the cross section area is eventually constrained by the cap, it makes it possible to increase the occupancy by providing the protruding portion.

In addition, it is preferable that, from the viewpoint of the heat dissipation property, the cross section area of the stem block is set such that a cross section area contacting the stem base 101 is larger than a cross section area at a height of the forward luminous point of the laser chip 103. See FIG. 1C.

Furthermore, in the first embodiment, an outer diameter of the stem block 102 (breadth maximum B: 2.9 mm) is set to be greater than a distance D of 2.1 mm from the forward luminous point of the laser chip to the stem base. Accordingly, it makes it possible to contribute to enhance the heat capacity and improve the heat dissipation property.

Within a lower surface 101b of the stem base 101, a rear block region 101c, which is located at a rear (back) side of the stem block 102, is not provided with a lead pin including the lead pin 105 for the power supply. In other words, the rear block region 101c is absent of any lead pins including the lead pin 105 for the power supply and other lead pins. Furthermore, the rear block region 101c is of a flat surface shape. The rear block region 101c corresponds to an example of a pinless region according to the present invention. With this kind of rear block region 101c being provided, according to the semiconductor laser device 100 of the present embodiment, it makes it possible to attain a higher heat dissipation property, as the exhaust heat pathway is the shortest by allowing the rear block region 101c to contact, for example, the heat dissipating block or the like.

Figure 4A:
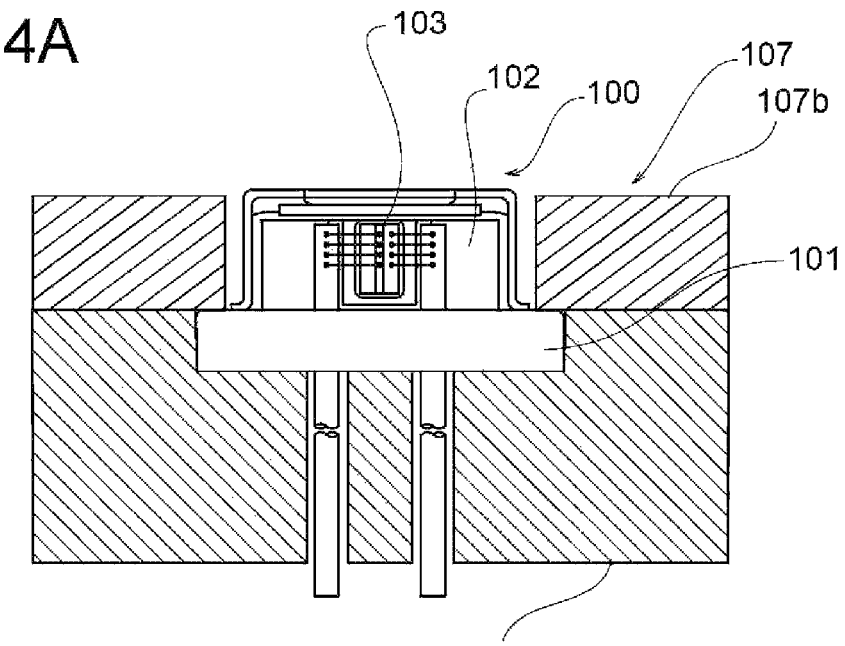
FIG. 4A is a view illustrating the first embodiment of the semiconductor laser device in a state that a heat sink is attached to the semiconductor laser device.
Figure 4B:
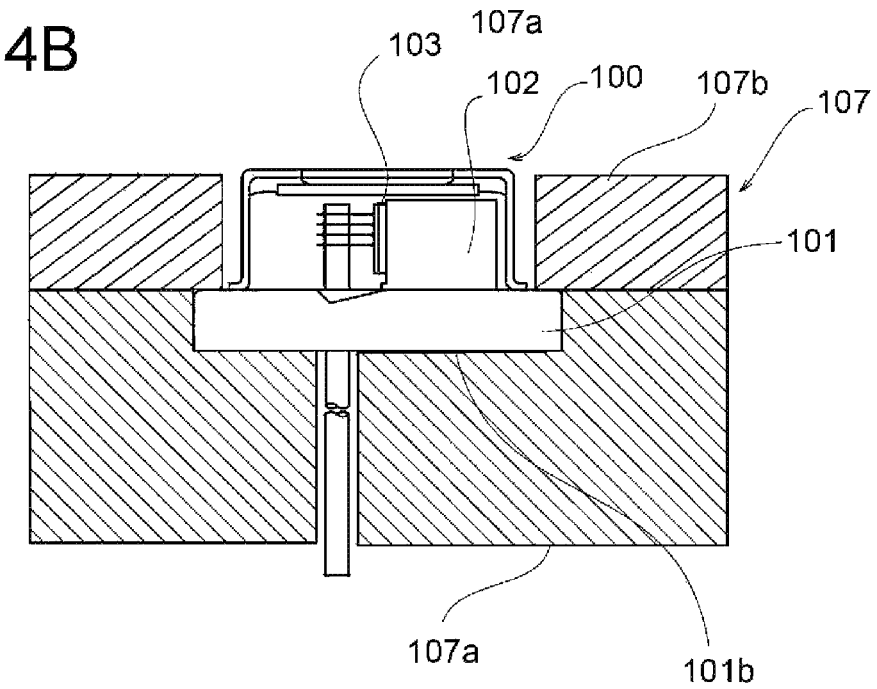
FIG. 4B is a view illustrating the first embodiment of the semiconductor laser device in a state that a heat sink is attached to the semiconductor laser device.

FIGS. 4A and 4B are views illustrating a state in which a heatsink is attached to the semiconductor laser device according to the first embodiment.

The heatsink 107 includes a lower heatsink 107a and an upper heatsink 107b. The lower heatsink 107a and the upper heatsink 107b sandwich to fix the stem base 101 of the semiconductor laser device 100.

The lower heatsink 107a of the heatsink 107 is attached firmly to the lower surface 101b of the stem base 101, in particular, to the rear block region 101c shown in FIG. 1C. The heat generated by the laser chip 103 is quickly transferred to the heatsink 107 through the stem block 102 and the stem base 101, and then dissipated by the heatsink 107. As a result, it makes it possible to allow the quality of the laser light to be stable, and to suppress the shortening of the life duration of the semiconductor chip due to the heat.

Second Embodiment

Next, a second embodiment of the semiconductor laser device will be described below.

In the following description of the second embodiment, same or similar structure or component to the first embodiment will no more repetitively described, and a different structure or component will be described.

FIGS. 5A to 5C are views illustrating a semiconductor laser device according to the second embodiment. More particularly, FIG. 5A is a top view, FIG. 5B is a front view, and FIG. 5C is a cross sectional view.

The semiconductor laser device 200 according to the second embodiment is provided with a photodiode (abbreviated as "PD") 201 for an output monitoring on the inclined plane 101d. The photodiode 201 is configured to receive the light emitted from the backward of the laser chip 103 to monitor an output of the laser chip 103.

In order to supply power to the photodiode 201, the semiconductor laser device 200 according to the second embodiment is provided with a lead pin 202 for the PD and a common pin 203. Four pins are provided in total. A back of the lead pin 202 for the PD (that is, a length protruding from the upper surface 101a) is lower than a back of the lead pin 105 for the power supply. The lead pin 202 for the PD is connected to the photodiode 201 by a wire 204, and the common pin 203 is connected to the photodiode 201 through the stem. The photodiode 201 receives the light from the backward of the laser chip 103 and current flows in a state that inverse voltage is being applied between the lead pin 202 for the PD and the common pin 203 so that the output can be monitored.

Third Embodiment

Next, a third embodiment of the semiconductor laser device will be describe below.

Similarly to the second embodiment, in the following description of the third embodiment, same or similar structure or component to the second embodiment will no more repetitively described, and a different structure or component will be described.

Figure 6:
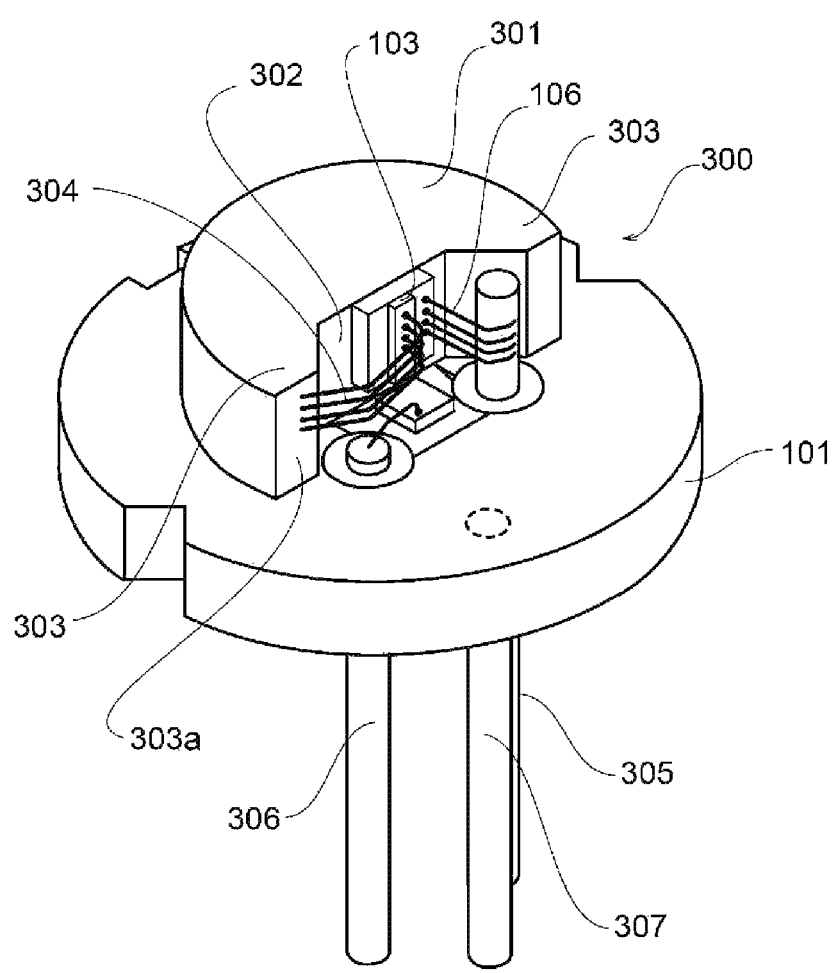
FIG. 6 is a view illustrating a third embodiment of the semiconductor laser device according to the present invention.

FIG. 6 is a view illustrating a semiconductor laser device according to the third embodiment.

In the semiconductor laser device 300 according to the third embodiment, a wire connecting surface 303a, which aligns with a direction of the chip mounting surface 302, is formed in the protruding portion 303 of the stem block 301. A wire 304 for the power supply extending from the laser chip 103 is connected to the wire connecting surface 303a. Here, the wire connecting surface 303a corresponds to an example of a wire joining face according to the present invention. Hereinafter and throughout the specification, "align with a direction of" means to be that directions are substantially the same each other, and mathematically strict identicalness is not required.

As described above, because the wire connecting surface 303a aligns with the direction of the chip mounting surface 302, it makes it possible to connect the wire 304 by use of a commonly used normal wire bonding device without relying on a peculiar kind of wire bonding device capable of rotating the wire connecting surface or changing an angle thereof.

With the wire 304 for the power supply being connected to the wire connecting surface 303a, the stem block 301 fulfils a role to substitute one of the lead pins 305 for the power supply. For this reason, in the semiconductor laser device 300 according to the third embodiment, the number of the lead pin 305 for the power supply for supplying power to the laser chip 103 is just one. The number of pins is in total three, that is, the lead pin 305 for the power supply, the lead pin 306 for the PD, and the common pin 307.

Fourth Embodiment

Lastly, a fourth embodiment of the semiconductor laser device will be described below.

Similarly to the third embodiment, in the following description of the fourth embodiment, same or similar structure or component to the third embodiment will no more repetitively described, and a different structure or component will be described.

Figure 7C:
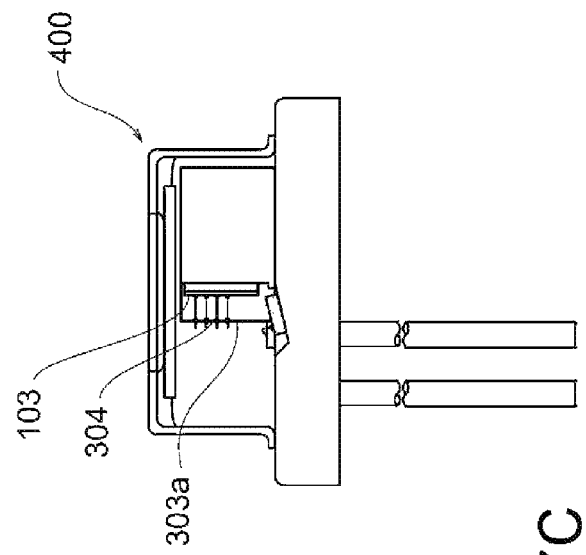
FIG. 7C is a view illustrating a fourth embodiment of the semiconductor laser device according to the present invention.
Figure 7A:
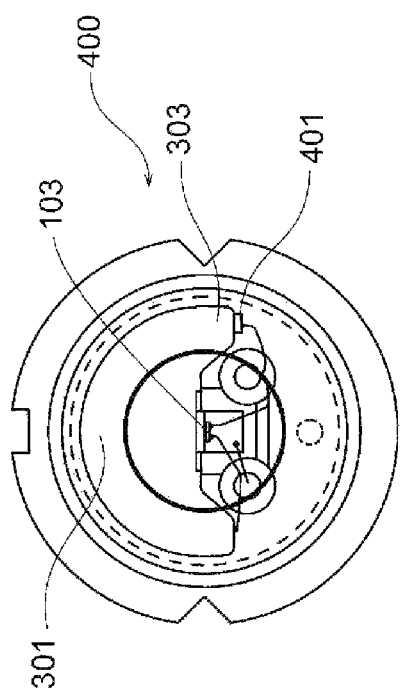
FIG. 7A is a view illustrating a fourth embodiment of the semiconductor laser device according to the present invention.
Figure 7B:
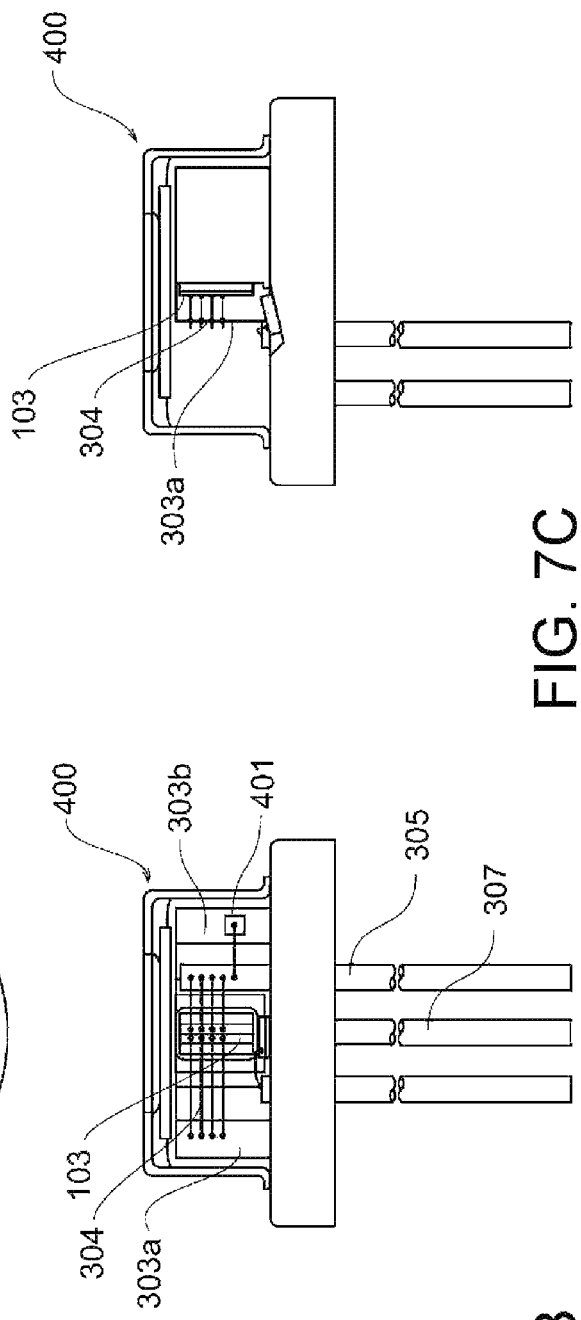
FIG. 7B is a view illustrating a fourth embodiment of the semiconductor laser device according to the present invention.

FIGS. 7A to 7C are views illustrating a semiconductor laser device according to the fourth embodiment.

In the semiconductor laser device 400 according to the fourth embodiment, a mounting surface 303b on which a Zener diode 401 in mounted is provided in a protruding portion 303 at an opposite side of the other protruding portion 303 in which the wire connecting surface 303a is provided. The Zener diode 401 is connected to the laser chip 103 in parallel and joined onto the mounting surface 303b. With the Zener diode 401 being provided, even when excessive inverse current flows between the lead pin 305 for the power supply and the common pin 307, it makes it possible to effectively protect the laser chip 103 by flowing the excessive inverse current into the Zener diode 401.

While certain embodiments have been described, these embodiments have been presented by way of example only, and are not intended to limit the scope of the present invention. The novel devices, apparatuses and methods thereof described herein may be embodied in a variety of other forms. Furthermore, various omissions, substitutions, modifications and changes in the form of the devices, apparatuses and methods thereof described herein may be made without departing from the gist of the present invention. The accompanying claims and their equivalents are intended to cover such forms of modifications as would fall within the scope and gist of the present invention.

The present application is based upon and claims the benefit of a priority from Japanese Patent Application No. 2015-193338, filed on Sep. 25, 2015, and the entire content of this Japanese Patent Application is incorporated herein by reference.

REFERENCE SIGNS LIST

100; 200; 300; 400: Semiconductor Laser Device
101: Stem Base
101c: Rear Block Region
102; 301: Stem Block
102a; 302: Chip Mounting Surface
102a; 303: Protruding Portion
104: Stem Cap
104a: Window
103: Laser Chip
103a: Sub-mount
105; 305: Lead Pins for Power Supply
401: Zener Diode
303a: Wire Connecting Surface
307: Common Pin

What is claimed is:

1. A semiconductor laser device, comprising:
a base comprising a first surface and a second surface opposite to the first surface;
a block configured to protrude from the first surface of the base, the block comprising a flat surface oriented perpendicular to the first surface of the base and two protruding portions protruding from the flat surface, the flat surface and the protruding portions defining a recess viewed perpendicularly to the first surface and the second surface of the base, the protruding portions are inclined with respect to the flat surface such that the recess has a width that enlarges away from the flat surface;
a laser chip located in the recess and configured to be directly or indirectly joined onto the flat surface of the block, and allow heat generated when emitting light to be transferred to the block;
a cap configured to cover the block and be fixed on the first surface of the base;
a window provided on the cap and configured to allow the light emitted from the laser chip to pass through;
two lead pins configured to penetrate the base, one end of each of the lead pins protruding inside the cap and being at least partially located in the recess, and the lead pins being positioned farther from the flat surface of the block than the laser chip; and
a pinless region configured to be provided on the second surface of the base, the pinless region being provided with no pins, including the lead pins, wherein the pinless region on the second surface of the base occupies an area corresponding to an area of the block on the first surface of the base,
wherein the block occupies an area equal to or greater than 50% of an area of the first surface of the base enclosed with an inner face of the cap.

2. The semiconductor laser device according to claim 1, wherein the pinless region of the base is of a flat surface shape.

3. The semiconductor laser device according to claim 1, wherein the two lead pins are provided for power supply to the laser chip, and
the lead pins are disposed at positions within a range having an angle equal to or greater than 60 degrees and equal to or less than 120 degrees, the angle being between a line from the laser chip to one of the two lead pins and a line from the laser chip to the other of the two lead pins.

4. The semiconductor laser device according to claim 1, wherein the two lead pins are provided for power supply to the laser chip, and
the lead pins are disposed at positions within a range having an angle equal to or greater than 90 degrees and equal to or less than 110 degrees, the angle being between a line from the laser chip to one of the two lead pins and a line from the laser chip to the other of the two lead pins.

5. The semiconductor laser device according to claim 1, wherein the laser chip comprises a forward luminous point and a backward luminous point, the forward luminous point being closer to the window than the backward luminous point, the block having a breadth maximum in a direction along the first surface of the base greater than a distance from the first surface to the forward luminous point of the laser chip.

6. The semiconductor laser device according to claim 1, wherein the laser chip is supplied with power by a plurality of wires from at least one of the lead pins.

7. The semiconductor laser device according to claim 6, wherein the wires are located at a position visible through the window.

8. The semiconductor laser device according to claim 1, wherein the pinless region is in contact with a heat dissipating member.

9. The semiconductor laser device according to claim 1, wherein the laser chip comprises a forward luminous point and a backward luminous point, the forward luminous point being closer to the window than the backward luminous point, the block comprising a bottom being in contact with the first surface of the base, a cross section area of the bottom of the block being larger than a cross section area of the block at a height of the forward luminous point.

* * * * *